United States Patent
Luo

(10) Patent No.: US 10,964,917 B2
(45) Date of Patent: Mar. 30, 2021

(54) DISPLAY MODULE AND METHOD FOR PREPARING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Hongqiang Luo, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/523,239

(22) Filed: Jul. 26, 2019

(65) Prior Publication Data

US 2020/0185654 A1 Jun. 11, 2020

(30) Foreign Application Priority Data

Dec. 7, 2018 (CN) .......................... 201811495891.7

(51) Int. Cl.
*G02F 1/29* (2006.01)
*G02F 1/1335* (2006.01)
(Continued)

(52) U.S. Cl.
CPC ........ *H01L 51/5275* (2013.01); *G06F 3/0443* (2019.05); *G02B 6/003* (2013.01);
(Continued)

(58) Field of Classification Search
CPC . G03H 2223/19; G06F 3/0443; G06F 3/0446; G09G 3/3208; H01L 51/0014; H01L 51/52; H01L 51/5237; H01L 51/5253; H01L 51/5262; H01L 51/5275; H01L 51/5281; H04N 13/305;
(Continued)

(56) References Cited

U.S. PATENT DOCUMENTS 7,991,257 B1 * 8/2011 Coleman ............ B29D 11/0073
264/1.24
8,033,706 B1 * 10/2011 Kelly .................... G02B 6/0036
362/307
(Continued)

FOREIGN PATENT DOCUMENTS

| CN | 1719955 A | 1/2006 |
|---|---|---|
| CN | 1791291 A | 6/2006 |

(Continued)

OTHER PUBLICATIONS

First Office Action for Chinese Application No. 201811495891.7, dated Jun. 29, 2020, 9 Pages.

*Primary Examiner* — Michael J Eurice
(74) *Attorney, Agent, or Firm* — Brooks Kushman P.C.

(57) ABSTRACT

The present disclosure provides a display module and a method for preparing the same. The display module includes a display panel and a light-concentrating layer arranged on a light-exiting surface of the display panel, in which the light-concentrating layer includes a plurality of light-concentrating units for concentrating light from the light-exiting surface.

14 Claims, 4 Drawing Sheets

(51) Int. Cl.
  *H01L 51/52* (2006.01)
  *G06F 3/041* (2006.01)
  *G06F 3/044* (2006.01)
  *G02B 30/27* (2020.01)
  *F21V 8/00* (2006.01)
  *G02F 1/13357* (2006.01)
  *H01L 51/56* (2006.01)
  *G09G 3/3208* (2016.01)
  *H04N 13/305* (2018.01)

(52) U.S. Cl.
  CPC ........ *G02B 30/27* (2020.01); *G02F 1/133526* (2013.01); *G02F 1/133611* (2013.01); *G02F 1/29* (2013.01); *G06F 3/0446* (2019.05); *G09G 3/3208* (2013.01); *H01L 51/5253* (2013.01); *H01L 51/56* (2013.01); *H04N 13/305* (2018.05)

(58) Field of Classification Search
  CPC ............ Y10T 156/1039; G02B 3/0006; G02B 3/0031; G02B 5/1814; G02B 5/021; G02B 5/0231; G02B 5/0252; G02B 5/0278; G02B 5/04; G02B 5/045; G02B 6/002; G02B 6/003; G02B 6/0036; G02B 6/005; G02B 6/0051; G02B 6/0073; G02B 6/0076; G02B 27/30; G02B 30/27; G02B 30/36; G02F 1/29; G02F 1/1335; G02F 1/133526; G02F 1/133528; G02F 1/133602; G02F 1/133603; G02F 1/133606; G02F 1/133611; G02F 1/1343; G02F 1/134309; G02F 2001/133607; G02F 2202/02; G02F 2001/294
  See application file for complete search history.

(56) References Cited

U.S. PATENT DOCUMENTS

| | | | | |
|---|---|---|---|---|
| 8,177,408 | B1* | 5/2012 | Coleman | G02B 3/005 362/615 |
| 8,465,193 | B1* | 6/2013 | Arik | G02B 5/0257 362/618 |
| 8,619,363 | B1* | 12/2013 | Coleman | G02B 5/0242 359/576 |
| 10,421,217 | B2* | 9/2019 | Li | B33Y 10/00 |
| 2003/0035972 | A1* | 2/2003 | Hanson | B32B 27/08 428/480 |
| 2005/0151119 | A1* | 7/2005 | Jones | G02B 6/0053 252/299.1 |
| 2005/0207035 | A1* | 9/2005 | Nagao | G02B 6/0053 359/831 |
| 2005/0231085 | A1 | 10/2005 | Song et al. | |
| 2006/0007552 | A1 | 1/2006 | Takakuwa et al. | |
| 2006/0072342 | A1* | 4/2006 | Kim | G02B 6/0036 362/620 |
| 2006/0152931 | A1* | 7/2006 | Holman | G02B 27/283 362/297 |
| 2006/0197078 | A1 | 9/2006 | Yu | |
| 2008/0111259 | A1* | 5/2008 | Lee | G02B 6/0065 264/1.7 |
| 2008/0117519 | A1 | 5/2008 | Chari et al. | |
| 2008/0165315 | A1* | 7/2008 | Nishida | G02B 1/118 349/137 |
| 2008/0297459 | A1* | 12/2008 | Sugimoto | G02B 5/09 345/102 |
| 2009/0052164 | A1* | 2/2009 | Kashiwagi | G09G 3/3413 362/97.2 |
| 2010/0046049 | A1* | 2/2010 | Kroll | G03H 1/2294 359/9 |
| 2010/0097439 | A1* | 4/2010 | Kroll | G03H 1/0005 348/14.02 |
| 2010/0134720 | A1* | 6/2010 | Choi | G02B 5/0221 349/64 |
| 2011/0012139 | A1 | 1/2011 | Yamamoto | |
| 2011/0025946 | A1* | 2/2011 | Wang | G02B 6/0053 349/62 |
| 2011/0085110 | A1* | 4/2011 | Lin | G02F 1/133606 349/64 |
| 2011/0234580 | A1* | 9/2011 | Wang | G02B 6/0053 345/418 |
| 2012/0008067 | A1* | 1/2012 | Mun | G02B 6/003 349/65 |
| 2012/0199859 | A1 | 8/2012 | Shikina et al. | |
| 2012/0236043 | A1* | 9/2012 | Jung | G09G 3/003 345/690 |
| 2014/0104871 | A1* | 4/2014 | Boyd | G02B 5/045 362/606 |
| 2014/0355125 | A1* | 12/2014 | Boyd | G02B 5/0236 359/599 |
| 2014/0367873 | A1* | 12/2014 | Yang | G02B 5/0215 264/2.5 |
| 2015/0346504 | A1* | 12/2015 | Kim | G02F 1/29 349/33 |
| 2016/0067931 | A1* | 3/2016 | Yang | B29C 33/3842 428/156 |
| 2016/0131813 | A1* | 5/2016 | Hikmet | G02B 6/0041 362/611 |
| 2016/0170100 | A1* | 6/2016 | Wang | G06F 1/1601 600/301 |
| 2016/0377790 | A1* | 12/2016 | Liu | G02B 6/0073 362/608 |
| 2017/0003436 | A1* | 1/2017 | Inoue | G02B 6/0038 |
| 2017/0069877 | A1* | 3/2017 | Tian | G02B 5/045 |
| 2017/0104041 | A1* | 4/2017 | Wang | H01L 51/0096 |
| 2017/0113481 | A1* | 4/2017 | Hersch | B42D 25/328 |
| 2017/0151717 | A1* | 6/2017 | Li | H04N 1/40031 |
| 2017/0315374 | A1* | 11/2017 | Zhou | G02B 27/30 |
| 2017/0365817 | A1* | 12/2017 | Wang | H01L 51/56 |
| 2018/0004041 | A1* | 1/2018 | Shin | G02F 1/133606 |
| 2018/0016490 | A1* | 1/2018 | Shin | C09K 11/06 |
| 2018/0024394 | A1* | 1/2018 | Xu | G02F 1/13338 345/173 |
| 2018/0046002 | A1* | 2/2018 | Zhao | G02F 1/133526 |
| 2018/0102449 | A1* | 4/2018 | Pschenitzka | H01L 27/14621 |
| 2018/0120576 | A1* | 5/2018 | Gao | G02B 30/36 |
| 2018/0129113 | A1* | 5/2018 | Wang | H01L 51/5262 |
| 2018/0134953 | A1* | 5/2018 | Shin | F21V 9/45 |
| 2018/0203286 | A1* | 7/2018 | Yang | B29D 11/00865 |
| 2018/0246270 | A1* | 8/2018 | Di Trapani | G02B 6/0013 |
| 2018/0356703 | A1* | 12/2018 | Wang | G02F 1/29 |
| 2019/0042036 | A1 | 2/2019 | Yang et al. | |
| 2020/0003944 | A1* | 1/2020 | Di Trapani | F21V 14/003 |
| 2020/0021797 | A1* | 1/2020 | Liu | H04N 13/305 |
| 2020/0128233 | A1* | 4/2020 | Jannard | H04N 13/356 |
| 2020/0150333 | A1* | 5/2020 | Vasylyev | G02B 6/0065 |

FOREIGN PATENT DOCUMENTS

| | | | |
|---|---|---|---|
| CN | 102629622 | A | 8/2012 |
| CN | 103813562 | A | 5/2014 |
| CN | 106410059 | A | 2/2017 |
| CN | 107452283 | A | 12/2017 |
| WO | 2009119889 | A1 | 10/2009 |

* cited by examiner

DISPLAY MODULE AND METHOD FOR PREPARING THE SAME

CROSS-REFERENCE TO RELATED APPLICATION

This application claims priority to Chinese Patent Application No. 201811495891.7 filed on Dec. 7, 2018, which is incorporated herein by reference in its entirety.

TECHNICAL FIELD

The present disclosure relates to the field of display technology, in particular, to a display module and a method for preparing the same.

BACKGROUND

Since a display panel has a multi-layer structure, light is diverged in various directions after passing through the layers, leading to the light emitted to the outside of the display panel having a large divergence angle, so that the display brightness in the front view region of the display panel is insufficient.

In order to allow the front view region on the display side of the display panel to have a sufficient display brightness, it is necessary to increase the display power, thereby causing a large power consumption of the product.

SUMMARY

An embodiment of the present disclosure provides a display module including a display panel and a light-concentrating layer arranged on a light-exiting surface of the display panel, in which the light-concentrating layer includes a plurality of light-concentrating units for concentrating light from the light-exiting surface.

In an example, the plurality of light-concentrating units includes a plurality of prism structures and/or a plurality of plano-convex lens structures.

In an example, an angle between two prism surfaces proximate to each other in two adjacent prism structures is 40° to 120°.

In an example, in a cross section of each of the plurality of plano-convex lens structures perpendicular to an extension direction thereof, a central angle corresponding to an arcuate shape of a convex surface is 80° to 180°.

In an example, the light-concentrating layer further includes a substrate, and the plurality of light-concentrating units is arranged on a surface of the substrate away from the display panel.

In an example, each of the plurality of prism structures has a height of 5 μm to 10 μm and a width of 10 μm to 20 μm, and the substrate has a thickness of 5 μm to 10 μm.

In an example, the substrate has a thickness of 10 μm to 15 μm; and in each of the plurality of plano-convex lens structures, a height of a convex surface is ⅓ of the thickness of the substrate, a diameter of an orthogonal projection of the convex surface on a surface of the substrate is 20 μm to 50 μm, and a pitch between two adjacent plano-convex lens structures is 0 μm to 5 μm.

In an example, two adjacent light-concentrating units are arranged in proximity to each other.

In an example, the display module further includes: a bonding layer arranged on a side of the light-concentrating layer away from the display panel; and a cover plate arranged on a side of the bonding layer away from the light-concentrating layer, in which a refractive index of the light-concentrating layer is less than a refractive index of the bonding layer.

In an example, the bonding layer is an optically clear adhesive (OCA) layer, and the cover plate is composed of a glass substrate, polymethyl methacrylate, polycarbonate or polyimide.

In an example, a refractive index of the cover plate is equal to or slightly greater than the refractive index of the bonding layer.

In an example, the light-concentrating layer is made of a transparent organic material.

In an example, the display module further includes: a touch panel arranged on a side of the light-concentrating layer toward the display panel; and a touch panel bonding layer arranged between the touch panel and the display panel.

In an example, the touch panel includes a touch base substrate and a touch electrode layer arranged on a side of the touch base substrate away from the display panel.

In an example, the display panel is an organic light-emitting diode (OLED) display panel, and the substrate is made of a packaging material.

One embodiment of the present disclosure provides a method for preparing a display module as described above. The method includes: providing a display panel; and forming a light-concentrating layer above a light-exiting surface of the display panel, in which the light-concentrating layer includes a plurality of light-concentrating units for concentrating light from the light-exiting surface.

In an example, the plurality of light-concentrating units includes a plurality of prism structures and/or a plurality of plano-convex lens structures. The forming the light-concentrating layer above the light-exiting surface of the display panel includes: forming a transparent thin film above the light-exiting surface of the display panel by a coating process or a deposition process; and processing the transparent thin film by a nanoimprint process or a halftone mask patterning process, to form the plurality of prism structures and/or the plurality of plano-convex lens structures.

BRIEF DESCRIPTION OF THE DRAWINGS

In order to illustrate the technical solutions of the present disclosure or the related technology in a clearer manner, the drawings desired for the present disclosure or the related technology will be briefly hereinafter briefly. Obviously, the following drawings merely relate to some embodiments of the present disclosure. Based on these drawings, a person skilled in the art may obtain other drawings without any creative effort.

DETAILED DESCRIPTION

Figure 1:
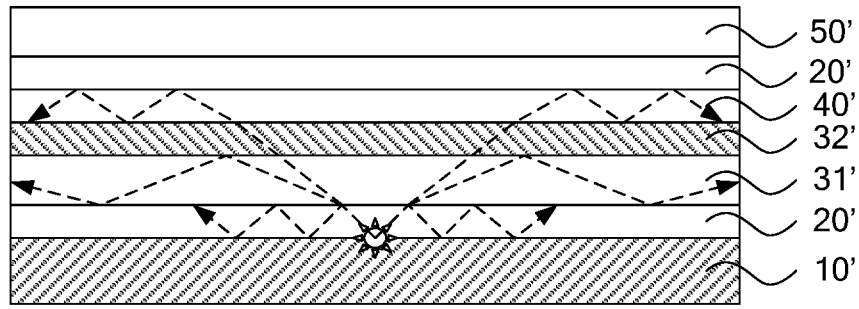
FIG. 1 is a schematic cross-sectional view showing a display module of the related art.

The technical solutions in the embodiments of the present disclosure will be described hereinafter in conjunction with the drawings in a clear and complete manner. Obviously, the following embodiments relate to a part of, rather than all of, the embodiments of the present disclosure. Based on these embodiments, a person skilled in the art may, without any creative effort, obtain other embodiments, which also fall within the scope of the present disclosure.

Hereinafter, the terms "first" and "second" are merely used for descriptive purposes, and are not to be construed as indicating or implying a relative importance or implicitly indicating the number of technical features indicated. Thus, the features defined by "first" or "second" may include one or more of the features, either explicitly or implicitly. In the description of the embodiments of the present disclosure, "a plurality of" means two or more, unless otherwise defined.

It should be noted that all terms (including technical and scientific terms) used in the embodiments of the present disclosure have the same meaning as commonly understood by a person skilled in the art to which the invention belongs, unless otherwise defined. It should also be understood that terms such as those defined in the ordinary dictionary should be interpreted into the meanings consistent with their meaning in the context of the related art, and not interpreted into idealized or extremely formalized meanings, unless explicitly defined herein.

For example, the terms "first", "second", and similar terms used in the description and claims of the present disclosure do not denote any order, quantity, or importance, but rather merely serves to distinguish different components. The terms "including", "comprising", and the like used in the present disclosure means that the element or item appeared in front of the term encompasses the element or item listed after the word and their equivalents, and does not exclude other elements or items. The terms "on/above", "under/below", "row/row direction", and "column/column direction" and the like indicating the orientation or spatial relationship is based on the orientation or spatial relationship shown in the drawings, and are merely for the convenience of describing the technical solution of the present disclosure and the simplification of the description, rather than indicating or implying that the referred device or element must have a particular orientation, or be constructed and operated in a particular orientation. Thus, it should not be construed as a limitation on the present invention.

As shown in FIG. 1, a display module 01' of the related art includes: a display panel 10'; and one bonding layer 20', a touch sensor substrate 30', a touch electrode layer 31', an organic protective layer 40', another bonding layer 20' and a cover plate (for example, cover glass, abbreviated as CG) 50', which are sequentially arranged on a light-exiting side of the display panel 10' (i.e., the upper side of the display panel 10' as shown in FIG. 1).

The display panel 10' is, for example, an OLED display panel having advantages such as self-illumination, fast response, and low driving voltage. OLED devices emitting different colors (such as red, blue, and green) are array arranged in the OLED display panel. Since multiple layers of structure are provided above the OLED display panel, only about 20% of the light is emitted outside the OLED device, and about the rest 80% of the light is confined within the OLED device due to total reflection (the light transmission path is shown by the dotted arrow in FIG. 1). The light emitted outside the OLED device has a large divergence angle, resulting in insufficient display brightness in the front view region of the display side. In order to ensure the front view region of the display side to have certain display brightness, a higher OLED illuminating current is required, resulting in a large power consumption of the entire display module.

Therefore, in order to satisfy the requirement that the display panel has relatively high display brightness and reduce the power consumption thereof, it is required to improve the luminous efficiency in the front view region of the display panel.

Based on this, in order to solve the above technical problem, embodiments of the present disclosure provides a display module and a method for preparing the same, which can gather light emitted by a display panel in a display module to be emitted within a small angle range, that is, increase the light brightness in the front view region of the display panel, thereby reducing product power consumption.

Figure 2:
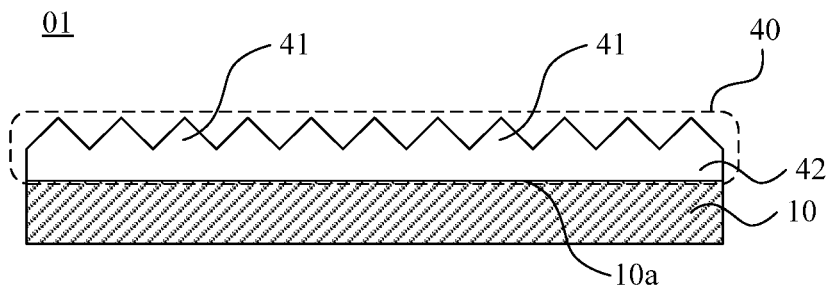
FIG. 2 is a schematic cross-sectional view showing a display module according to one embodiment of the present disclosure.
Figure 3:
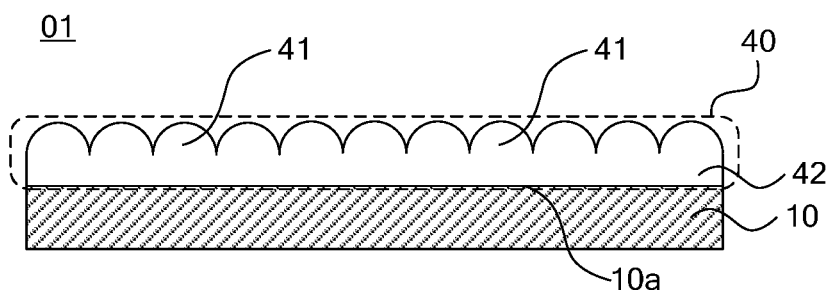
FIG. 3 is a schematic cross-sectional view showing a display module according to yet another embodiment of the present disclosure.

An embodiment of the present disclosure provides a display module, as shown in FIG. 2 and FIG. 3. The display module 01 includes: a display panel 10; and a light-concentrating layer 40 arranged on a light-exiting surface 10a of the display panel 10, in which the light-concentrating layer 40 includes a plurality of light-concentrating units 41 for concentrating light from the light-exiting surface 10a.

It should be noted that, in an example of an embodiment of the present disclosure, the number, the distribution mode, the shape, the size and other parameters of the light-concentrating unit 41 are not limited, as long as the light-concentrating unit 41 can gather the light from the light-emitting surface 10a of the display panel 10, so that the light from the light-concentrating unit 41 converges to emit within a small angle range.

Thus, the display module 01 according to an embodiment of the present disclosure provides a light-concentrating layer 40 on the light-emitting surface 10a of the display panel 10, and the plurality of light-concentrating units 41 in the light-concentrating layer 40 converges light from the light-emitting surface 10a, such that the divergent light having a large viewing angle from the display panel 10 is gathered to be emitted within a small angle range, thereby increasing the brightness of the display light in the front view region of the display panel 10, further reducing the power consumption of the overall display module, and ultimately prolonging the endurance time of the product.

Here, in one example, to facilitate the preparation of the light-concentrating layer 40, the light-concentrating layer 40 may be made of a transparent organic material.

In an example, in order to further enhance the light-concentrating effect of the plurality of light-concentrating units 41, referring to FIG. 2 and FIG. 3, two adjacent light-concentrating units 41 are arranged in proximity to each other, that is, there is no gap between the bottoms of two adjacent concentrating units 41 on a side toward the light-emitting surface 10a of the display panel 10.

Further, in one example, referring to FIG. 2 and FIG. 3, the light-concentrating layer 40 further includes a substrate 42 and the light-concentrating layer 40 is arranged on a surface of the substrate 42 away from the display panel 10. That is, a substrate 42 as a base is further arranged below the plurality of light-concentrating units 41 for ease of preparation. Moreover, the substrate 42 can also protect the underlying structure from damage when the light-concentrating unit 41 is formed.

Further, the display panel 10 is for example an OLED display panel, including: an array substrate, a pixel defining layer, an anode, a light-emitting layer, a cathode, and the like; and an anode, a light-emitting layer (which may further include an electron transport layer, a hole transport, and other light-emitting functional layers) and a cathode constitute an OLED device.

When the display panel 10 is an OLED display panel, the substrate 42 can be made of a packaging material, so that the substrate 42 arranged in the light-concentrating layer 40 can also function as a packaging layer to package and protect the OLED display panel, so as to improve the lifetime of the OLED device in the OLED display panel.

Here, the packaging material for forming the substrate 42 may be, for example, an inorganic and/or organic material, which is structurally dense, stable in performance, and capable of preventing moisture and oxygen from corroding the OLED device. For the specific aspect, the related art may be used, and the embodiment of the present invention will not have a limitation to this.

Figure 4:
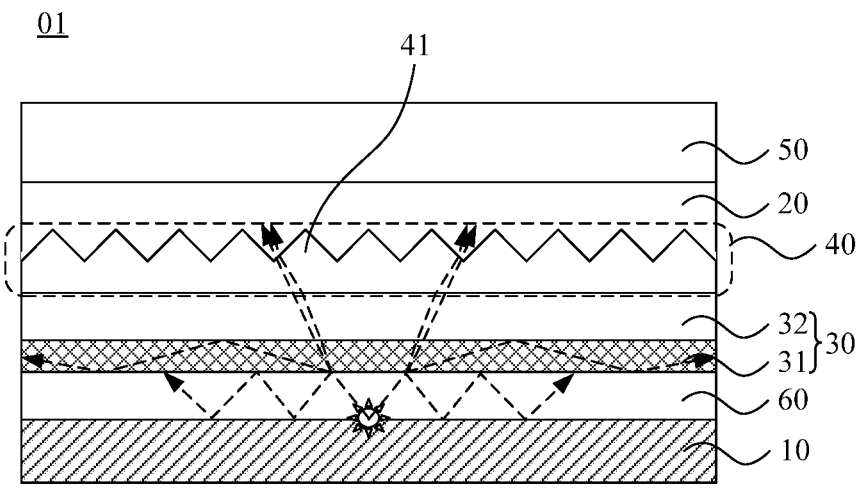
FIG. 4 is a schematic cross-sectional view showing a display module according to another embodiment of the present disclosure.
Figure 5:
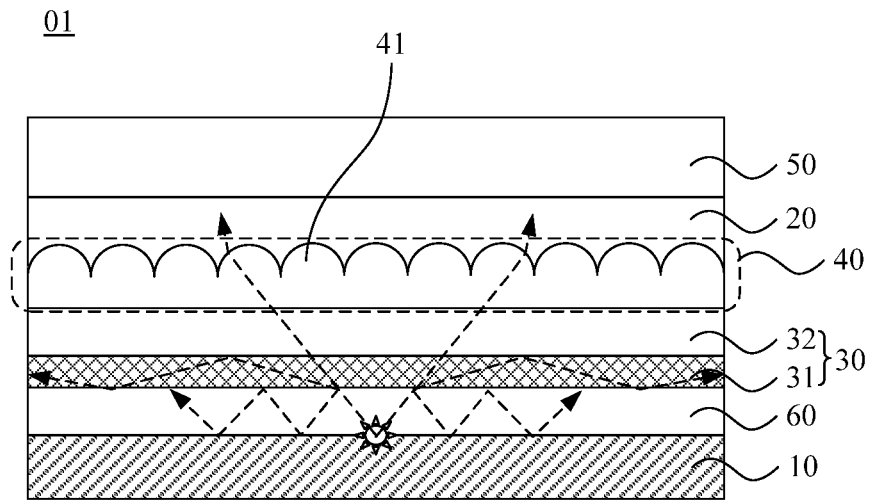
FIG. 5 is a schematic cross-sectional view showing a display module according to still yet another embodiment of the present disclosure.

Further, in an example, as shown in FIG. 4 or FIG. 5, the display module 01 further includes: a bonding layer 20 arranged on a side of the light-concentrating layer 40 away from the display panel 10; and a cover plate 50 arranged on a side of the bonding layer 20 away from the light-concentrating layer 40.

The bonding layer 20 may be, for example, an optically clear adhesive (OCA) layer, that is, an adhesive for bonding a transparent optical element, which has properties such as being colorless and transparent, having a high light transmittance (usually above 90%) and a good bonding strength, being curable at room temperature or a temperature slightly above room temperature, and having a small curing shrinkage.

The cover plate 50 may be for example a rigid substrate such as glass, or a flexible substrate such as polymethyl methacrylate (PMMA), polycarbonate (PC) and polyimide (PI), for protecting the structures such as the display panel 10 and the light-concentrating layer 40.

In one example, in order to achieve a relatively large critical angle when light is irradiated to the interface between the light-concentrating layer 40 and the bonding layer 20, so as to emit more light, the refractive index of the light-concentrating layer 40 should be less than the refractive index of the bonding layer 20.

It can be understood that since the cover plate 50 is a transparent or high transmittance structure for protecting the display panel 10, and the bonding layer 20 is a transparent or high transmittance structure used for bonding the cover plate 50 and the light-concentrating layer 40, in one example, the refractive index of the cover plate 50 should be equal to the refractive index of the bonding layer 20, or only slightly larger than the refractive index of the bonding layer 20, so as to minimize the loss of the emitted light caused by the cover plate 50 and the bonding layer 20.

For example, when the cover plate 50 is a glass substrate having a refractive index of 1.51 or 1.52, the bonding layer 20 may be an OCA adhesive having a refractive index of 1.51 or 1.52, to prevent a secondary refraction of light, thereby further increasing the light emission rate.

Further, the display module 01 is, for example, a touch display module, referring to FIG. 4 or FIG. 5. The display module 01 further includes: a touch panel 30 arranged on a side of the light-concentrating layer 40 toward the display panel 10; and a touch panel bonding layer 60 arranged between the touch panel 30 and the display panel 10.

Here, the touch panel 30 includes, for example, a touch base substrate 31 and a touch electrode layer 32 arranged on a side of the touch base substrate 31 away from the display panel 10.

The touch base substrate 31 may be, for example, a transparent glass substrate or a transparent flexible substrate.

In one example, the thickness of the touch electrode layer 32 is usually only 1 μm to 2 μm, and the touch electrode layer 32 includes a plurality of touch scan electrodes (Tx) and a plurality of touch sensing electrodes (Rx), which are crossed and electrically insulated. The crossing area of the touch scan electrode and the touch sensing electrode can be used as a of touch sensor for sensing the touch position.

Figure 6:
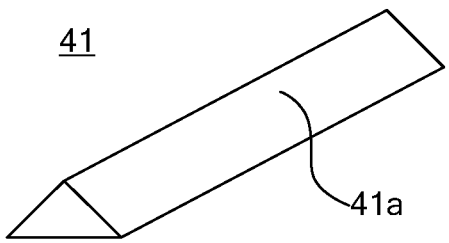
FIG. 6 is a schematic perspective view showing the structure of a single prism structure of FIG. 2 or FIG. 4.

For example, referring to FIG. 2 or FIG. 4, the plurality of light-concentrating units 41 includes a plurality of prism structures, and the three-dimensional structure diagram of the prism structure is as shown in FIG. 6. Thus, the refraction effect of the prism surface 41a can be used for gathering the divergent light having a large viewing angle from the light-emitting surface 10a of the display panel 10 to be emitted within a small angle range, and the light transmission path is as shown by a dotted arrow in FIG. 4.

Figure 7:
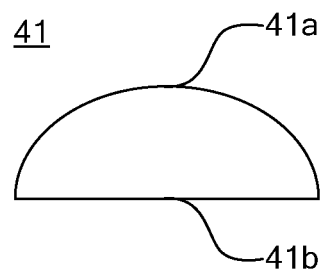
FIG. 7 is a schematic enlarged cross-sectional view showing a single plano-convex lens structure of FIG. 3 or FIG. 5.

Alternatively, for example, referring to FIG. 3 or FIG. 5, the above-mentioned plurality of light-concentrating units 41 includes a plurality of plano-convex lens structures. The enlarged structure of the plano-convex lens structure is as shown in FIG. 7, and the convex surface 41a is away from the light-emitting surface 10a and the flat surface 41b faces the light-emitting surface 10a. Thus, the refraction effect of the convex surface 41a can be used for gathering the divergent light having a large viewing angle from the light-emitting surface 10a of the display panel 10 to be emitted within a small angle range, and the light transmission path is as showed by a dotted arrow in FIG. 5.

Alternatively, referring to FIG. 2 to FIG. 7, the above-mentioned plurality of light-concentrating units 41 may also include a plurality of prism structures and a plurality of plano-convex lens structures. Thus, the refraction effect of the prism surfaces 41a and the convex surfaces 41a can be used for gathering the divergent light having a large viewing angle from the light-emitting surface 10a of the display panel 10 to be emitted within a small angle range.

Here, in order to reduce the difficulty in the preparation of the light-concentrating layer 40, for example, the above-mentioned light-concentrating layer 40 may be set such that all the light-concentrating units 41 are prism structures or all the light-concentrating units 41 are plano-convex lens structures so as to facilitate the preparation. Hereinafter, the exemplary parameter setting of the light-concentrating layer 40 will be described by taking all the light-concentrating units 41 being prism structures or all the light-concentrating units 41 being plano-convex lens structures as an example.

Figure 8:
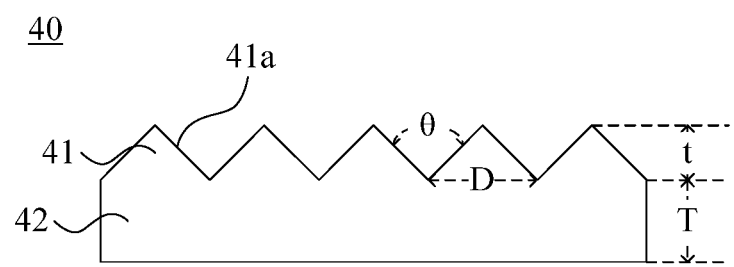
FIG. 8 is a schematic cross-sectional view showing a parameter setting of a light-concentrating layer in a display module according to one embodiment of the present disclosure.

As shown in FIG. 8, in two adjacent prism structures, an angle θ between the two prism surfaces 41a proximate to each other is 40° to 120°, and further may be 90°.

For example, the height t of each prism structure is 5 μm to 10 μm; the width D of each prism structure is twice its height t (D=2*t), that is, 10 μm to 20 μm; and the thickness T of the substrate 42 is equal to t (T=t), that is, 5 μm to 10 μm.

For example, the length the prism structure in the extending direction (i.e., the direction perpendicular to the paper surface in FIG. 8) may be equal to the size of the display panel in the same direction, so as to gather as much light as possible.

It should be noted that the above parameter settings are only an optional setting mode in experimental simulation. In the actual preparing process, the above parameters can be flexibly adjusted according to the size of the display panel, the material of the light-concentrating layer, and the like, and the embodiment of the present invention will not have a limitation to this.

Figure 9:
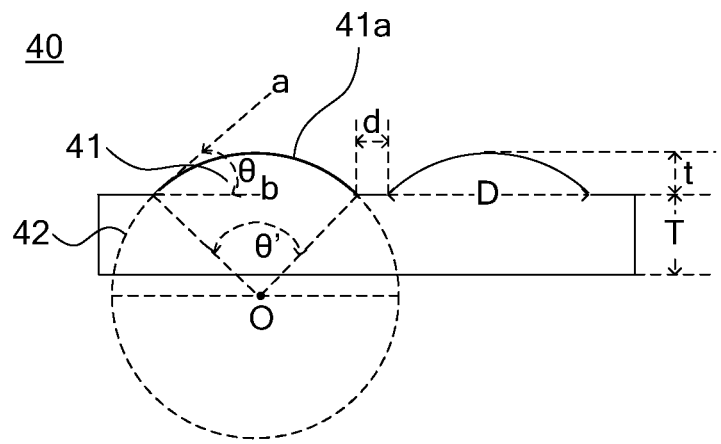
FIG. 9 is a schematic cross-sectional view showing a parameter setting of a light-concentrating layer in a display module according to another embodiment of the present disclosure.

As shown in FIG. 9, in a cross section of each of the plurality of plano-convex lens structures perpendicular to an extension direction thereof, a central angle θ' corresponding to an arcuate shape of a convex surface (the center of the circle is shown by the letter "O" in FIG. 9) is 80° to 180°.

In FIG. 9, a circle, in which the arc of the convex surface in the cross section of each plano-convex lens structure is located, is indicated by the dotted circle, the apex of the chord tangent angle θ of the arc is located on the circle, and the chord tangent angle θ is an angel formed by a side b and another side a in the cross section, in which the side b connects the two end points of the arc, the side a is tangent line to the circle in which the arc is located, and the chord tangent angle θ is used to characterize the protruding degree of each plano-convex lens structure.

According to the alternate segment theorem, the chord tangent angle θ is equal to half the central angle θ' of the arc sandwiched by the chord tangent angle θ, so that when the central angle θ' is 80° to 180°, θ is 40° to 90°.

For example, the thickness T of the substrate 42 is 10 μm to 15 μm. In each plano-convex lens structure, the height t of the convex surface is equal to ⅓T; the diameter D of the orthogonal projection of the convex surface on a surface of the substrate 42 is 20 μm to 50 μm, and a pitch d between two adjacent plano-convex lens structures is 0 μm to 5 μm.

It should be noted that the above parameter settings are only an optional setting mode in experimental simulation. In the actual preparing process, the above parameters can be flexibly adjusted according to the size of the display panel, the material of the light-concentrating layer, and the like, and the embodiment of the present invention will not have a limitation to this.

Figure 10:
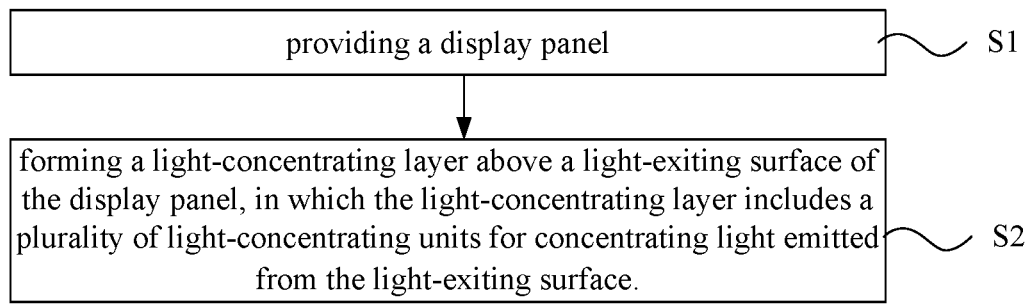
FIG. 10 is a schematic flow chart showing a method for preparing a display module according to one embodiment of the present disclosure.

Another aspect of the present disclosure provides a method for preparing the above-mentioned display module, and as shown in FIG. 10, the method includes steps S1 to S2:

S1: providing a display panel; and

S2: forming a light-concentrating layer above a light-exiting surface of the display panel, in which the light-concentrating layer includes a plurality of light-concentrating units for concentrating light from the light-exiting surface.

The beneficial effects that can be achieved by the above-mentioned preparation method are the same as those of the display module provided by the embodiment of the present disclosure, and are not described herein again.

It should be noted that the light-concentrating layer may be directly formed on the surface of the light-emitting surface of the display panel, or may be arranged on, for example, the surface of the touch panel according to the requirements for the structure of the display module, as long as it is arranged above the light-emitting surface of the display panel. The embodiments of the present disclosure do not limit other structural layers between the light-concentrating layer and the display panel.

Taking the above plurality of light-concentrating units including a plurality of prism structures and/or a plurality of plano-convex lens structures as an example, the step S2 includes, for example, sub-step S21 to sub-step S22:

S21: forming a transparent thin film above the light-exiting surface of the display panel by a coating process or a deposition process; and S22: processing the transparent thin film by a nanoimprint process or a halftone mask patterning process, to form the plurality of prism structures and/or the plurality of plano-convex lens structures.

It should be noted that the coating process or the deposition process used in step S21 does not have a one-to-one correspondence to the nanoimprint process or the halftone mask patterning process used in step S22. That is, when a transparent thin film is formed over the light-emitting surface of the display panel by the coating process used in step S21, the transparent thin film may be processed by a nanoimprint process or a halftone mask patterning process used in step S22 to form a plurality of prism structures and/or a plurality of plano-convex lens structures. Similarly, when a transparent thin film is formed over the light-emitting surface of the display panel by the deposition process used in step S21, the transparent thin film may be processed by a nanoimprint process or a halftone mask patterning process used in step S22 to form a plurality of prism structures and/or a plurality of plano-convex lens structures.

Here, the process of the nanoimprint process is shown as follows:

(A) A transparent thin film is placed under the imprinting mold, in which the imprinting mold has a structure complementary to the prism structure and/or the plano-convex lens structure to be formed.

(B) By using the imprinting mold and a structure under the transparent thin film (e.g., a display panel) arranged opposite to each other, the transparent thin film therebetween is pressed; and by using the pressing mechanism therebetween, a plurality of prism structures and/or plano-convex lens structures is formed on the surface of the transparent thin film.

(C) After the pressing is completed, the substrate and the plurality of prism structures and/or the plano-convex lens structures formed on the surface of the substrate may be cured by illumination or heating, to maintain the corresponding structure pressed by the imprinting mold.

(D) A demolding operation is performed to obtain the light-concentrating layer formed above the display panel.

The process of the halftone mask patterning process for example includes: the transparent thin film is subjected to a patterning process by using a halftone mask, to form a substrate and a plurality of prism structures and/or plano-convex lens structures formed on the surface of the substrate.

As for a specific process, referring to the related art, the embodiment of the present disclosure will not have a limitation to this.

The above display module provided by the embodiment of the present disclosure may be any device that displays an image regardless of being movable (e.g., video) or fixed (e.g., still image) and regardless of text or picture. More specifically, it is contemplated that the described embodiments can be implemented in or associated with a variety of electronic devices including, but not limited to, mobile phones, wireless devices, personal data assistants (PDA), handheld or portable computers, global positioning system (GPS) receivers/navigators, cameras, MP4 (full name MPEG-4 Part 14) video players, video cameras, game consoles, watches, clocks, calculators, television monitors, flat panel displays, computer monitors, car displays (e.g., odometer display, etc.), navigator, cockpit controller and/or displays, camera view displays (e.g., displays for a rear-view camera in a vehicle), electronic photographs, electronic billboards or signs, projectors, architectural structures, packaging and aesthetic structures (e.g., displays for displaying images of a piece of jewelry), etc.

In the description of the above embodiments, the specific characteristics, structures, materials or features may be combined in any suitable manner in any one or more embodiments or examples.

The above description is merely the specific embodiment of the present disclosure, but the scope of the present disclosure is not limited thereto. Moreover, a person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A display module, comprising:
   a display panel; and
   a light-concentrating layer arranged on a light-exiting surface of the display panel,
   wherein the light-concentrating layer comprises a plurality of light-concentrating units for concentrating light from the light-exiting surface; and
   there is no gap between the bottoms of two adjacent light-concentrating units on a side toward the light-emitting surface of the display panel,
   wherein the plurality of light-concentrating units comprises a plurality of prism structures and/or a plurality of plano-convex lens structures; and
   wherein in a cross section of each of the plurality of plano-convex lens structures perpendicular to an extension direction thereof, a central angle corresponding to an arcuate shape of a convex surface is 80° to 180°;
   wherein the display module further comprises:
   a touch panel arranged on a side of the light-concentrating layer toward the display panel; and
   a touch panel bonding layer arranged between the touch panel and the display panel.

2. The display module of claim 1, wherein an angle between two prism surfaces proximate to each other in two adjacent prism structures is 40° to 120°.

3. The display module of claim 1, wherein the light-concentrating layer is made of a transparent organic material.

4. The display module of claim 1, wherein the touch panel comprises a touch base substrate and a touch electrode layer arranged on a side of the touch base substrate away from the display panel.

5. The display module of claim 1, further comprising:
   a bonding layer arranged on a side of the light-concentrating layer away from the display panel; and
   a cover plate arranged on a side of the bonding layer away from the light-concentrating layer,
   wherein a refractive index of the light-concentrating layer is less than a refractive index of the bonding layer.

6. The display module of claim 5, wherein the bonding layer is an optically clear adhesive layer (OCA), and the cover plate is composed of a glass substrate, polymethyl methacrylate, polycarbonate or polyimide.

7. The display module of claim 5, wherein a refractive index of the cover plate is equal to or slightly greater than the refractive index of the bonding layer.

8. The display module of claim 1, wherein the light-concentrating layer further comprises a substrate, and the plurality of light-concentrating units is arranged on a surface of the substrate away from the display panel.

9. The display module of claim 8, wherein each of the plurality of prism structures has a height of 5 μm to 10 μm and a width of 10 μm to 20 μm, and the substrate has a thickness of 5 μm to 10 μm.

10. The display module of claim 8, wherein the substrate has a thickness of 10 μm to 15 μm; and in each of the plurality of plano-convex lens structures, a height of a convex surface is ⅓ of the thickness of the substrate, a diameter of an orthogonal projection of the convex surface on a surface of the substrate is 20 μm to 50 μm, and a distance between orthogonal projections of convex surfaces of two adjacent plano-convex lens structures on the surface of the substrate away from the display panel is 0 μm to 5 μm.

11. The display module of claim 8, wherein the display panel is an organic light-emitting diode (OLED) display panel, and the substrate is made of a packaging material.

12. A method for preparing the display module of claim 1, comprising:
   providing a display panel; and
   forming a light-concentrating layer above a light-exiting surface of the display panel, wherein the light-concentrating layer comprises a plurality of light-concentrating units for concentrating light from the light-exiting surface,
   wherein the plurality of light-concentrating units comprises a plurality of prism structures and/or a plurality of plano-convex lens structures; and
   the forming the light-concentrating layer above the light-exiting surface of the display panel comprises:
   forming a transparent thin film above the light-exiting surface of the display panel by a coating process or a deposition process; and
   processing the transparent thin film by a nanoimprint process or a halftone mask patterning process, to form the plurality of prism structures and/or the plurality of plano-convex lens structures; and
   wherein in a cross section of each of the plurality of plano-convex lens structures perpendicular to an extension direction thereof, a central angle corresponding to an arcuate shape of a convex surface is 80° to 180°.

13. The method of claim 12, wherein an angle between two prism surfaces proximate to each other in two adjacent prism structures is 40° to 120°.

14. The method of claim 12, further comprising:
   forming a bonding layer on a side of the light-concentrating layer away from the display panel; and
   forming a cover plate on a side of the bonding layer away from the light-concentrating layer,
   wherein a refractive index of the light-concentrating layer is less than a refractive index of the bonding layer.

* * * * *